United States Patent [19]

Schaer et al.

[11] Patent Number: 4,597,836
[45] Date of Patent: Jul. 1, 1986

[54] METHOD FOR HIGH-SPEED PRODUCTION OF METAL-CLAD ARTICLES

[75] Inventors: Glenn R. Schaer, Columbus; Joseph R. Preston, Radnor, both of Ohio

[73] Assignee: Battelle Development Corporation, Columbus, Ohio

[21] Appl. No.: 759,526

[22] Filed: Jul. 26, 1985

Related U.S. Application Data

[63] Continuation-in-part of Ser. No. 349,291, Feb. 16, 1982.

[51] Int. Cl.⁴ ............... C25D 1/02; C25D 1/10; C25D 1/20
[52] U.S. Cl. ............................. 204/4; 204/9
[58] Field of Search .................. 204/3, 4, 6, 9, 12, 204/216

[56] References Cited

U.S. PATENT DOCUMENTS

| | | | |
|---|---|---|---|
| 1,969,054 | 8/1934 | Wilkins | 204/216 |
| 3,441,487 | 4/1969 | Rea | 204/4 |
| 4,053,370 | 10/1977 | Yamashita | 204/231 |
| 4,080,268 | 3/1978 | Suzuki | 204/218 |
| 4,119,516 | 10/1978 | Yamaguchi | 204/15 |

OTHER PUBLICATIONS

I.B.M. Technical Disclosure Bulletin, vol. 14, No. 1, Jun. 1971, p. 60.
Plating, Jan. 1968, pp. 40-46.

*Primary Examiner*—T. M. Tufariello
*Attorney, Agent, or Firm*—Philip M. Dunson; Philip J. Pollick

[57] ABSTRACT

A die used for plastic injection molding is masked on its inner surface with a plating resist to leave only a selected area exposed. A conforming anode is fit into the die leaving a small clearance between the die cavity surface and the anode. A metal layer is electroplated onto the exposed mold surfaces of the die in less than a minute by using a high current density and a turbulent flow of electroplating solution. The die is then assembled with a second die to form a mold. A plastic molding composition is injected into the mold cavity and comes in contact with and adheres to the metal electroplate more tightly than the metal electroplate adheres to the surface of the mold member. As the mold is separated, the metal electroplate remains bonded to the plastic molding composition to form a metal-clad plastic article. Adhesion between the metal electroplate and the plastic can be improved by forming nodular growths on the metal electroplate. This is done by varying the current density and/or the electroplating solution flow-rate near the end of the electroplating process. The electroplating and molding steps may be sequentially combined into an automated process for the continuous production of metal-clad articles.

34 Claims, 5 Drawing Figures

METHOD FOR HIGH-SPEED PRODUCTION OF METAL-CLAD ARTICLES

This application is a continuation-in-part of application Ser. No. 349,291, filed Feb. 16, 1982.

FIELD

This invention relates to a method for the high-speed metal plating of plastics. More specifically, it is directed toward the high-speed plating of plastics in the same mold in which the plastics are formed. Moreover, the bonding of the plating to the plastic occurs simultaneously with the formation of the plastic article in the mold.

BACKGROUND

A need to use light-weight components as a means to achieve better fuel economies has existed in the automotive and aircraft industries for several years. In addition, there is a growing need to shield out electromagnetic and radio frequency emissions from car radios, truck skid-control braking systems, ignition equipment, microprocessor-based engine-control systems, and systems found in the communication, aerospace, computer, and medical industries. One method for solving these weight and electromagnetic and radio frequency shielding problems is through the electrodeposition of a metallic coating on plastics, commonly called metal electroplating, metal plating, or simply plating. However, metal plating of plastics, as it is currently practiced, involves a long series of time, material, and labor consuming preplating steps as well as a lengthy set of plating steps.

Typically the part to be plated is removed from a forming mold; cleaned thoroughly to remove dirt, fingerprints, particles, die lubricants, etc.; preconditioned to allow for a uniform etch; etched (involving one or more etching and rinsing steps) to afford better metal to plastic adhesion; neutralized of the residues from etching; treated with a catalyst to make the surface more receptive to the deposition of a thin conductive metallic coating on the plastic; treated with an accelerator to promote the effectiveness of the catalyst; coated with a metallic preplate to give the necessary conductivity for the electroplating steps; and plated with copper for 10–20 minutes. The cycle time for the preplating and plating steps is typically in the range of 45 to 60 minutes. Moreover, the etching step necessary to afford metal-plastic adhesion often requires the use of etchable plastics or the addition of etchable materials to the plastic. See, for example, "Plastics Engineering Handbook," 4th edition, 1976, Joel Frados, editor, po. 742-749.

Although the plating of surfaces and the subsequent adhesion of materials to the electroplate to produce metal-clad materials is known (as in Canada Patent 473,507, R. N. Sabee, et. al., May 8, 1951; U.S. Pat. No. 3,649,474, B. E. Blakeslee, et. al., Mar. 14, 1972; U.S. Pat. No. 3,689,729, G. E. Neward et. al., Sept. 5, 1972; IBM Technical Disclosure Bulletin, 1, 14, 60 (June 1971)), problems of long plating times, additional steps, and poor electroplate to material retention have precluded this methodology from gaining widespread acceptance and replacing the aforementioned state of the art. Long plating times have been especially troublesome and rather than use this technique, it has been found that it is more efficient to mold a large number of plastic articles and then plate all of them in a batch process. Coating of surfaces by methods other than electroplating, with the subsequent adhesion of materials to the coating to form coated articles also is known (U.S. Pat. No. Re. 28,068, J. H. Lemelson, July 9, 1974).

High-speed electroplating has been described (U.S. Pat. Nos. 4,053,370, K. Yamashita, et. al., Oct. 11, 1977; 4,080,268, S. Suzuki, et. al., Mar. 21, 1978; 4,119,516, S. Yamaguchi, Oct. 10, 1978; and Plating and Finishing, 7, 68, 52-55 (July 1981)), but it has not been used in conjunction with the high-speed production of metal-clad molded articles.

OBJECTS

It is an object of this invention to provide a method for the rapid metal plating of plastics which can be accomplished in a few steps and in a very short time.

Another object of this invention is to provide a process wherein the metal electroplate is formed first and subsequently the plastic is simultaneously bonded to the metal electroplate and molded to the desired shape.

Another object of this invention is to provide a process wherein many of the aforementioned steps associated with the present state of the art are eliminated, thereby significantly reducing the time, labor and materials required to obtain a metal-plated plastic.

A further object of this invention is to broaden the range of materials which can be used in conjunction with the metal electroplate, e.g. glass-filled polymers can now be effectively plated.

A further object is to provide a process in which the metal plate contains a surface with nodular growths so as to strengthen the adhesion of the metal plate to the plastic.

A further object of this invention is to provide an improved process wherein the metal can be plated in a very short time so as to allow the various steps in the process to be automated and repeated in rapid succession on a large number of articles.

A further object is to provide a process wherein an electrode is used for plating which contains interior channels so as to promote a more effective turbulent electroplating solution flow, which allows for the use of higher current densities and as a result, decreases the plating time.

Another object of the invention is to provide a process wherein an electrode is used for plating which conforms to the shape of the surface to be plated in order to achieve a metal electroplate of uniform thickness.

SUMMARY

A typical process according to the present invention comprises the steps of rapidly electroplating a metallic electroplate layer onto the surface of a metallic mold through the use of high current densities and a turbulent flow of electroplating solution between the anode and the mold surface, contacting a plastic with the electroplated metallic layer such that the plastic material adheres more strongly to the electroplated layer than the electroplated layer adheres to the surface of the mold, and then separating the mold from the molded plastic article leaving the metallic layer bonded to the molded plastic article. The rapid electroplating step can be carried out in a time short enough to allow it to be combined with the other steps of the process and to allow for the repeated automation of the entire process.

Typically, the current density and the electroplating solution flow rate are maintained so as to produce an initial smooth layer of electroplate. After a smooth layer of electroplate is formed, variables which affect metal electroplate characteristics such as electroplating solution flow rate, current density, temperature, and electroplating solution concentration are varied so as to produce an electroplate surface containing nodular growths. These nodular growths are particularly effective in promoting the adhesion of the plastic to the metal electroplate.

The electrode which is used to plate the mold used for the plastic molding typically contains interior channels to promote the turbulent flow of electroplating solution between the anode and the mold surface to be plated and is shaped to conform to the surface of the mold. These features allow for the use of higher current densities to decrease plating times and better control of the metal plate surface characteristics and thickness uniformity.

An additional coating may be placed on the electroplate surface of the completed plastic article. This may be an additional electroplate layer or other suitable coating such as paint or laquer. It may be for desired decorative, structural, or corrosion resistant purposes.

DETAILED DESCRIPTION

This invention is directed to a process in which plastic articles are given a metallic coating by first rapidly electroplating all or portions of the molding surfaces of a mold and then molding a plastic article in the electroplated mold so as to transfer the electroplate from the mold to the surface of the plastic article.

Figure 1:
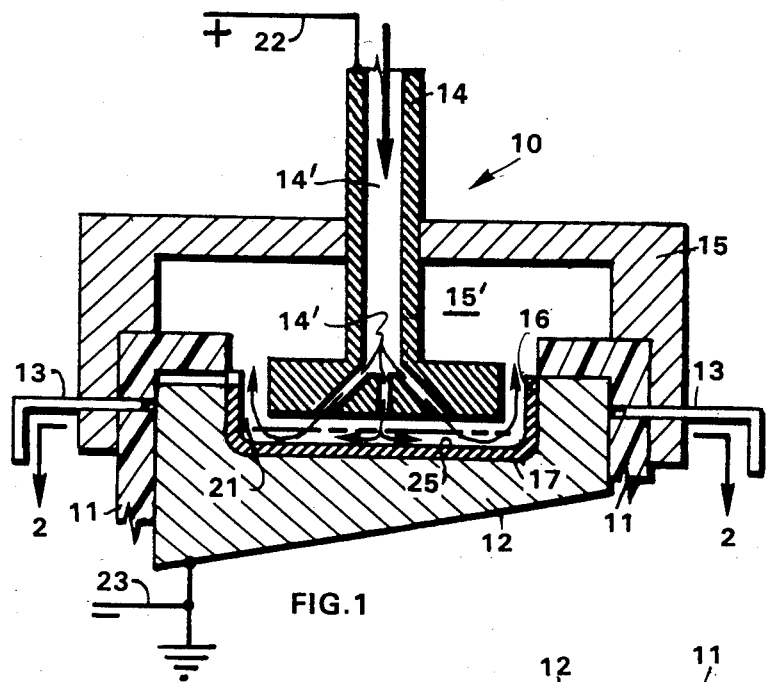
FIG. 1 is a front sectional view of the electroplating apparatus positioned over a mold member used for plastic molding in the present invention.

In FIG. 1, which illustrates a typical arrangement for the electroplating of a member of a mold, an electroplating apparatus 10 is mounted over a mask 11 and a mold member 12. The electroplating apparatus 10 is held in place over the mold member 12 by means of alignment pins 13. The electroplating apparatus 10 comprises an electrode 14 with interior channels 14' through which flows an electroplating solution, an alignment fixture 15 to hold the electrode 14 in position over the mold member 12, and the electrical conductors 22 and 23 by means of which the electrode 14 and the mold member 12 are connected to a source of positive and negative electrical potential (not shown). A metal electroplate 16 is deposited on the mold surface 17 of the mold member 12 by the application of a potential difference between the electrode 14 and mold member 12 (typically grounded at 23) while simultaneously turbulently flowing an electroplating solution between the electrode 14 and the mold member 12.

Figure 2:
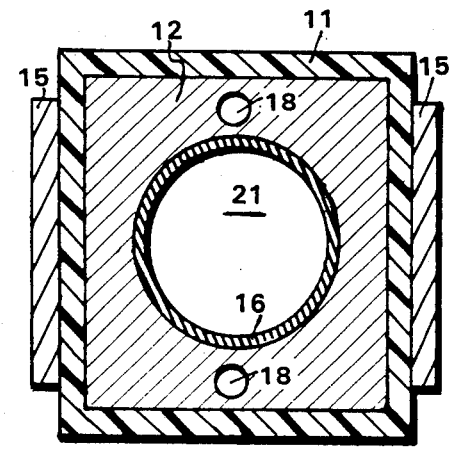
FIG. 2 is a top sectional view of a portion of the electroplating apparatus and the mold member of FIG. 1 taken in the plane 2—2 of FIG. 1.

FIG. 2 helps to illustrate the general shape of the mold member cavity 21 and the position of the alignment fixture 15. The alignment fixture 15 is positioned over the mold 12 so as to form a space 15' (FIG. 1) that is open at both ends to allow the electroplating solution to flow from the electroplating apparatus 10 after the electroplating solution has been pumped though the electrode channels 14' and caused to turbulently flow between the electrode 14 and the mold surface 17.

Figure 3:
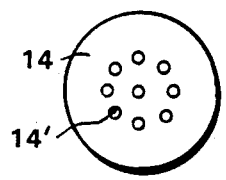
FIG. 3 is an end view of the electrode shown in FIG. 1.

FIG. 3 illustrates a typical arrangement of the lower ends of the internal channels 14' in the electrode 14. Such an arrangement allows a turbulent flow of electroplating solution to be maintained over all parts of the mold surface 17 being electroplated. As seen in FIG. 1 and FIG. 3, the shape of the electrode 14 conforms to the shape of the mold surface 17 being electroplated in order to achieve a metal electroplate 16 of relatively uniform thickness. The electrode 14 is an insoluble-type anode, typically comprising alloys of lead with tin or antimony, platinum, platinized titanium, or the like.

Although this invention is illustrated with a single anode 14 which contains interior channels 14' to obtain turbulent electrolyte flow in the plating step, multiple electrodes and other means for achieving turbulent flow such as stirring, use of nozzles, and the like may be used. The number, arrangement, and shape of the electrodes and means to achieve turbulent flow largely depend on the shape and size of the article to be plated.

Figure 4:
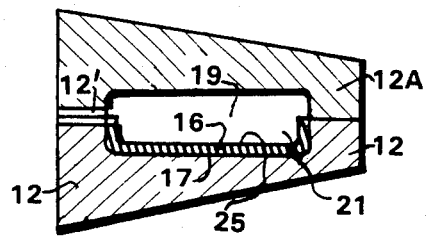
FIG. 4 is a front sectional view of the electroplated mold member of FIG. 1 assembled with a second unplated mold member so as to form a mold cavity.

FIG. 2 illustrates two alignment holes 18 which are used in conjunction with the alignment pins on a second mold member 12A so as to align the two mold members 12 and 12A when they are fitted together to form a mold cavity 19 as shown in FIG. 4. Molding material can be poured, injected, or otherwise caused to enter the mold cavity 19 through the inlet port or opening 12'. FIG. 4 illustrates a mold arrangement wherein only one side and half an edge of a plastic article 26 will be plated with metal. When the upper part of the article 26 is to be plated also, the upper mold member 12A may be provided with a metal deposit similar to the deposit 16 on the lower mold member 12. Other variations and patterns may be obtained by selectively masking various portions of the mold members 12 and 12A.

Figure 5:
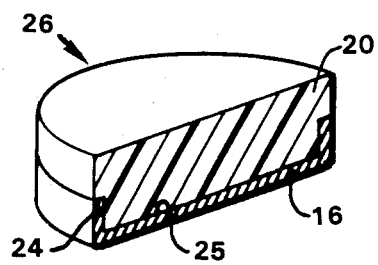
FIG. 5 is a perspective sectional view of a plastic article after it has been molded and removed from the apparatus shown in FIG. 4.

FIG. 5 illustrates the plated plastic article 26 after it has been removed from the mold illustrated in FIG. 4. FIG. 5 illustrates the selective plating of half of the plastic article 26 achieved by plating only one mold member 12 and also illustrates the surface at the junction 24 of the plastic body 20 and the metal electroplate 16.

Rapid electroplating of the mold surface 17 is carried out using high current densities and a turbulent flow of electrolyte solution between the electrode 14 and the mold surface 17. The following conditions are typical of those used to obtain a metal electroplate 16.

| | |
|---|---|
| Current Density | 20–600 A/dm$^2$ |
| Flow Velocity (between anode and mold surface) | 0.1–10 m/sec |
| Gap, between anode and mold surface | 1–4 mm |
| Electroplating Solution | |
| Copper Sulfate | 1–2 moles/liter |
| Sulfuric Acid | 0.5–0.8 moles/liter |
| Temperature | 30–60° C. |

Selection of appropriate conditions requires a balance among, (1) current density, (2) flow velocity, (3) temperature, and (4) copper ion in solution. With a satisfactory balance, it is possible to obtain a satisfactory electroplate 16 in about 15 sec. Although the invention is described herein with a copper electroplate, other electroplates such as nickel, iron, cobalt, zinc, brass, and the like may be used.

In one mode of operation, the mold 12 is enclosed in masking material 11 except for that portion of the mold surface 17 which is to be plated. The electroplating apparatus 10 is mounted over the mask 11 and the mold 12. The entire apparatus shown in FIG. 1 is then submerged in a container of electroplating solution. The electroplating solution is pumped from the container, through the electrode channels 14' in the direction of the arrows, and returned to the container of electroplating solution through the submerged openings at either end of the cavity 15'.

In a variation of FIG. 1, the cavity 15' is enclosed except for a small exit port to which is attached a piece of tubing through which the exiting electroplating solution can flow to a container of electroplating solution which is away from the electroplating apparatus 10 and from which electroplating solution is continuously pumped to the electrode channels 14'.

The above variations of the electroplating apparatus 10 serve only to show two of the many possible variations in the electroplating apparatus 10 which may be used with this invention. The shape and design of the electroplating apparatus 10 will in large part depend on the shape of the mold 12 to be plated and also on the molding equipment to be used. This is especially true if automated plating and molding equipment is used.

The mold surface 17 usually is polished to a smooth finish in order to provide a smooth and pore free electroplate coating 16 on the finished article 26. The presence of pores through the metal electroplate 16 could allow the molding plastic to contact the mold surface 17 and thus could cause the metal electroplate 16 to stick to the mold 12 or could result in a residue of plastic molding material on the surface of the metal plate 16 after the finished article 26 has been removed from the mold 12,12A. Such residue would interfere with the next plating cycle.

The mold surfaces 17 which are exposed to the electroplating solution typically comprise corrosion-resistant materials such as 304 Stainless or other austenitic steel. Mold surfaces 17 of materials such as carbon steel corrode quickly under the conditions used in rapid electroplating. When corrosion occurs on the mold surface 17, the metal electroplate 16 has a tendency to stick to the mold surface 17 rather than to the molded plastic 20.

Adhesion of the metal electroplate 16 to the mold surface 17 can be reduced by treating the mold surface 17 with such adhesion-reducing agents as graphite, chromate wash, and the like according to usual practices.

Adhesion of the molded plastic 20 to the metal electroplate 16 can be improved by the formation of nodular growths on the electroplate surface 25 during the last part of the electroplating process. Nodular growth is achieved by varying either or both the current density and the electroplating solution agitation in the region of the plating process. Increasing the current density while maintaining the same solution agitation or decreasing the solution agitation while maintaining the same current density will produce nodular growth. Nodular growth also can be obtained by increasing both the solution agitation and the current density such that the increase in current density is in greater proportion than the increase in solution agitation. For automated assembly-line operations, the time of the electroplating step for plating both the smooth and the nodular metal can be reduced to a value corresponding to the time of the molding sequence by increasing both solution agitation and current density.

The following conditions are typical of those used to obtain nodular growth on copper.

|  | Reduced Flow Velocity | Increased Current Density |
|---|---|---|
| Current Density | 20–300 A/dm$^2$ | 300–600 A/dm$^2$ |
| Flow Velocity (between anode and mold surface) | 0.1–1 m/sec | 1–2 m/sec |
| Gap, between anode and mold surface | 1–4 mm | Same |
| Electroplating Solution |  |  |
| Copper Sulfate | 1–2 moles/liter | Same |
| Sulfuric Acid | 0.5–0.8 moles/liter | Same |
| Temperature | 30–60° C. | Same |

The mold members 12 and 12A are of the kinds designed for use in injection molding. However, the process is also suitable for other molding techniques such as pour molding, reaction injection molding, transfer molding, compression molding, roto casting, and the like.

Greater adhesion between the plastic body 20 and the metal electroplate 16 can be achieved by adding coupling agents such as A-1100, a silane made by Union Carbide, to the molding formulation before it is injected into the mold cavity 19.

Shrinkage of the plastic material 20 during the molding process can be alleviated by the addition of materials such as chopped glass fibers to the molding composition.

Molding compositions 20 may comprise such materials as high density polyethylene, polycarbonate, ethylene vinyl acetate, and the like. Specific materials will depend on the end application of the metal-coated article 26.

Additional coatings may be applied to the metal-clad article 26 after it is removed from the mold 12,12A for such purposes as decoration, corrosion inhibition, and strength. Such additional coatings may include additional layers of electroplate such as bright nickel and chromium, laquers, paint, and the like.

The rapid electroplating of the mold member 12 allows the electroplating time to be reduced from the normal plating time of 10–20 minutes to about 20 sec. A plating time of 20 sec allows the electroplating step to be incorporated sequentially with the molding step and both steps automated by the use of automation equipment such as the 4 oz New Britain Injection Molder manufactured by New Britain Plastics Machine of New Britain, Conn.

EXAMPLE A

A stainless steel mold member 12 (304 alloy) with a 51 mm diameter and 1.5 mm deep mold cavity 21 was masked with a plating resist 11 leaving exposed only the mold cavity surface 17. The mold member 12 was fit with a conforming anode 14 of 93% lead-7% tin with about 3 mm clearance from the mold cavity surface 17. The disk-like anode 14 had a cluster of nine holes 14', each 3 mm diameter and about 6 mm center to center distance, for flow of electrolyte between the anode 14 and the die mold surface 17. Plating conditions used were:

| Current Density | 250 A/dm$^2$ |
|---|---|
| Flow Volume (radial) | 60 liters/min |
| Flow Velocity (peripheral minimum) | 2.0 m/sec |
| Plating Rate, average copper | 47 μm/min |
| Gap between anode and mold | 3 mm |
| Time | 15 sec |
| Total Current | 50 A |
| Copper Sulfate | 1.5 moles/liter |
| Sulfuric Acid | 0.5 moles/liter |
| Temperature | 50° C. |

On completion of the initial plating, the flow velocity was decreased to 0.75 m/sec and plating continued for another 2 sec to obtain nodular copper on the surface 17 of the electroplate 16.

The electroplating apparatus 10 was removed and the mold member 12 fitted with a second mold member 12A to form a complete mold. The assembled mold 12,12A was placed in a 1 oz Watson Stillman Injection Molder. The molding composition was formulated by mixing Ultrathene UE631, an ethylene vinyl acetate polymer manufactured by the U.S. Industrial Chemicals Company of New York, N.Y. A-1100, a silane coupling agent manufactured by Union Carbide (2 parts in 100 parts resin) and ¼ in. chopped glass fibers (6 parts in 100 parts resin). After mixing, the materials were ground in an Abbé mill to facilitate molding. The molding material was injected into the mold 12,12A at a melt temperature of 320° F. and a hydraulic pressure of about 2000 psi. Parts were molded in typical cycle times of 2-5 sec injection time, 10 sec hold time, and 15-30 sec cooling time for a total cycle time of 30-45 sec.

An additional decorative coating of about 1 mil of bright nickel and about 0.01 mil of bright chromium was applied to the copper-clad article. The copper surface was first cleaned in a proprietary cleaner compounded for cleaning non-ferrous metals (ENBOND 160 made by Enthone, Inc. of New Haven, Conn.), then rinsed and dipped into 3N sulfuric acid to remove any oxides, rinsed again, then nickel plated using the PERGLOW plating process (Harshaw Chemical Co. of Cleveland, OH). Plating conditions for the proprietary nickel solution were 140° F. and 5 A/dm$^2$ for about 25 minutes. The plating was rinsed and chromium plated in a solution containing 250 g/liter CrO$_3$ and 2.5 g/liter H$_2$SO$_4$, for about 2 minutes at 115° F. and 20 A/dm$^2$.

EXAMPLE B

A metal electroplate 16 of copper in mold cavity 21 was produced as in Example A and several samples of metal-clad article 26 were produced using a variety of plastic compositions including high density polyethylene, polycarbonate, fluoroethylenepropylene, polyformaldehyde, polyetherimide, polyphenylene oxide, polyether ether ketone, polyphenylene sulfide, polyolefins, or acrylonitrilebutadiene-styrene polymers.

EXAMPLE C

The electroplating apparatus 10 as in Example A was used to produce a metal electroplate 16 of nickel using a typical "Watts-type" nickel electroplating solution. Plating conditions used were:

| Current Density | 25 A/dm$^2$ |
|---|---|
| Flow Volume (radial) | 6 liters/min |
| Flow Velocity (peripheral minimum) | 0.2 m/sec |
| Gap, between anode and mold | 3 mm |
| Time | 300 sec |
| Total Current | 5A |
| Nickel Sulfate | 0.91 |
| Nickel Chloride | 0.17 |
| Boric Acid | 0.48 |
| pH | 2.8 |
| Temperature | 52° C. |

On completion of the initial plating, the current density was increased to 75 A/dm$^2$ for another 180 sec to obtain nodular nickel on the surface 17 of electroplate 16.

EXAMPLE D

The electroplating apparatus 10 as in Example A was used to produce a metal electroplate 16 of zinc. Plating conditions used were:

| Current Density | 50 A/dm$^2$ |
|---|---|
| Flow Volume (radial) | 6 liters/min |
| Flow Velocity (peripheral minimum) | 0.2 m/sec |
| Gap, between anode and mold | 3 mm |
| Time | 5 min |
| Total Current | 10 A |
| Zinc Sulfate | 1 mole/liter |
| pH | 3.5 |
| Temperature | 32° C. |

EXAMPLE E

A stainless steel mold member 12 (304 alloy) with a 51 mm and 1.5 mm deep mold cavity 21 was masked with a plating resist 11 leaving exposed only the mold cavity surface 17 as in Example A. The mold member 12 was fit with a solid conforming anode (i.e. interior channels 14' were eliminated). The alignment fixture 15 was modified so that solution entered one side of the fixture and exited from the opposite side with unidirectional flow in the gap between the anode 14 and die mold surface 17. Plating conditions used were:

| Current | 150 A/dm$^2$ |
|---|---|
| Flow Volume (transverse) | 12 liters/min |
| Flow Velocity (average) | 2.5 m/sec |
| Gap, between anode and mold | 1.6 mm |
| Time | 25 sec |
| Total Current | 30 |
| Copper Sulfate | 1.5 moles/liter |
| Sulfuric Acid | 0.5 moles/liter |
| Temperature | 50° C. |

On completion of the initial plating, the flow velocity was decreased to 0.6 m/sec and plating continued for another 5 sec to obtain nodular copper on the surface 11 of the electroplate 16.

Although, the invention is described herein with acid electroplating solutions, other commonly used electroplating solutions, such as neutral and alkaline solutions, may be used.

While the forms of the invention herein disclosed constitute presently preferred embodiments, many others are possible. It is not intended herein to mention all of the possible equivalent forms or ramifications of the invention. It is to be understood that the terms used herein are merely descriptive rather than limiting, and that various changes may be made without departing from the spirit or scope of the invention.

We claim:

1. A method for the high-speed production of metal-clad plastic articles, comprising the steps of:
    rapidly electroplating a metallic layer on a metallic surface by using a high current density and turbulent flow of an electroplating solution whose temperature is maintained at about 30° to 60° C., between an anode and said metallic surface, the distance between said anode and said metallic surface being about 1 to 4 mm;
    contacting said metallic layer with a plastic material so as to obtain greater adhesion between said metallic layer and said plastic material than the adhesion between said metallic layer and said metallic surface; and
    separating said metallic layer and said plastic material from said metallic surface;
    said electroplating step comprising the steps of:
        electroplating a smooth metallic layer on said metallic surface; and then
        electroplating nodular growths on said smooth metallic layer so as to aid in the adhesion of said metallic layer to said plastic material;
    the electroplating-solution flow rate to electroplate said smooth metallic layer being about 1 to 10 m/sec;
    the electroplating-solution flow rate to electroplate said nodular growths on said smooth metallic layer being about 0.1 to 1 m/sec; and
    said high current density between said anode and said metallic surface being about 20 to 600 A/dm$^2$.

2. A method for the high-speed production of metal-clad plastic articles, comprising the steps of:
    rapidly electroplating a metallic layer on a metallic surface by using a high current density and turbulent flow of an electroplating solution whose temperature is maintained at about 30° to 60° C., between an anode and said metallic surface, the distance between said anode and said metallic surface being about 1 to 4 mm;
    contacting said metallic layer with a plastic material so as to obtain greater adhesion between said metallic layer and said plastic material than the adhesion between said metallic layer and said metallic surface; and
    separating said metallic layer and said plastic material from said metallic surface;
    said electroplating step comprising the steps of:
        electroplating a smooth metallic layer on said metallic surface; and then
        electroplating nodular growths on said smooth metallic layer so as to aid in the adhesion of said metallic layer to said plastic material;
    the current density between said anode and said metallic surface to electroplate said smooth metallic layer being about 20 to 300 A/dm$^2$;
    the current density between said anode and said metallic surface to electroplate said nodular growths on said smooth metallic layer being about 300 to 600 A/dm$^2$; and
    the flow rate of said electroplating solution being about 0.1 to 10 m/sec.

3. A method as in claim 1, wherein the electroplating solution comprises an aqueous solution of about 1 to 2 moles per liter of a soluble salt of copper, nickel, or zinc.

4. A method as in claim 2, wherein the electroplating solution comprises an aqueous solution of about 1 to 2 moles per liter of a soluble salt of copper, nickel, or zinc.

5. A method as in claim 1, wherein the electroplating solution comprises about 1 to 2 moles of copper sulfate per liter, about 0.5 to 0.8 moles of sulfuric acid per liter, and the balance esentially water.

6. A method as in claim 2, wherein the electroplating solution comprises about 1 to 2 moles of copper sulfate per liter, about 0.5 to 0.8 moles of sulfuric acid per liter, and the balance essentially water.

7. A method as in claim 3, wherein the aqueous solution comprises nickel sulfate, nickel chloride, boric acid, and sulfuric acid, with a pH of about 2 to 5.

8. A method as in claim 4, wherein the aqueous solution comprises nickel sulfate, nickel chloride, boric acid, and sulfuric acid, with a pH of about 2 to 5.

9. A method as in claim 3, wherein the aqueous solution comprises zinc sulfate and sulfuric acid with a pH of about 3 to 5.

10. A method as in claim 4, wherein the aqueous solution comprises zinc sulfate and sulfuric acid with a pH of about 3 to 5.

11. A method as in claim 1, wherein said anode contains interior channels for the electroplating solution to promote said turbulent flow.

12. A method as in claim 2, wherein said anode contains interior channels for the electroplating solution to promote said turbulent flow.

13. A method as in claim 1, wherein the shape of said anode surface conforms to that of said metallic surface so as to maintain a substantially uniform distance between said anode surface and said metallic surface.

14. A method as in claim 2, wherein the shape of said anode surface conforms to that of said metallic surface so as to maintain a substantially uniform distance between said anode surface and said metallic surface.

15. A method as in claim 1, wherein said metallic surface has a composition and a surface finish so as to obtain less adhesion between said metallic layer and said metallic surface than between said metallic layer and said plastic material.

16. A method as in claim 2, wherein said metallic surface has a composition and a surface finish so as to obtain less adhesion between said metallic layer and said metallic surface than between said metallic layer and said plastic material.

17. A method as in claim 1, further comprising the step of applying an adhesion-reducing material to said metallic surface so as to reduce adhesion between said metallic surface and said metallic layer.

18. A method as in claim 2, further comprising the step of applying an adhesion-reducing material to said metallic surface so as to reduce adhesion between said metallic surface and said metallic layer.

19. A method as in claim 1, further comprising the step of adding an adhesion-enchancing composition to said plastic material so as to enhance adhesion between said metallic layer and said plastic material.

20. A method as in claim 2, further comprising the step of adding an adhesion-enhancing composition to said plastic material so as to enhance adhesion between said metallic layer and said plastic material.

21. A method as in claim 1, further comprising the step of coating said metallic layer with an additional material after said metallic layer and said plastic material have been separated from said metallic surface.

22. A method as in claim 2, further comprising the step of coating said metallic layer with an additional material after said metallic layer and said plastic material have been separated from said metallic surface.

23. A method as in claim 21, wherein said additional material is an organic polymer.

24. A method as in claim 22, wherein said additional material is an organic polymer.

25. A method as in claim 21, wherein said additional material is a metal electroplate.

26. A method as in claim 22, wherein said additional material is a metal electroplate.

27. A method as in claim 1, wherein said metallic surface is an interior surface of a mold.

28. A method as in claim 2, wherein said metallic surface is an interior surface of a mold.

29. A method as in claim 27, wherein said mold is an injection mold.

30. A method as in claim 28, wherein said mold is an injection mold.

31. A method as in claim 1, wherein said electroplating, contacting, and separating steps are repeated to produce a plurality of metal-clad plastic articles.

32. A method as in claim 2, wherein said electroplating, contacting, and separating steps are repeated to produce a plurality of metal-clad plastic articles.

33. An article produced by a method as in claim 1.

34. An article produced by a method as in claim 2.

* * * * *